(12) United States Patent
Komeda (10) Patent No.: US 9,997,592 B2
(45) Date of Patent: Jun. 12, 2018

(54) CAPACITOR, ARRAY OF CAPACITORS, AND DEVICE COMPRISING AN ELECTRODE

(71) Applicant: Micron Technology, Inc., Boise, ID (US)

(72) Inventor: Kenji Komeda, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 14/955,845

(22) Filed: Dec. 1, 2015

(65) Prior Publication Data
US 2017/0154952 A1  Jun. 1, 2017

(51) Int. Cl.
*H01L 49/02* (2006.01)
*H01L 27/01* (2006.01)

(52) U.S. Cl.
CPC ............ *H01L 28/90* (2013.01); *H01L 27/016* (2013.01)

(58) Field of Classification Search
CPC ......... H01L 27/10814; H01L 27/10894; H01L 28/91; H01L 28/90; H01L 27/016
See application file for complete search history.

(56) References Cited

U.S. PATENT DOCUMENTS

| 6,596,648 B2* | 7/2003 | Wu ..................... H01L 21/2815 257/E21.011 |
| 2009/0224362 A1* | 9/2009 | Lu ........................... H01L 28/82 257/532 |
| 2012/0299152 A1* | 11/2012 | Kemerer ............... H01L 27/016 257/532 |
| 2014/0131786 A1* | 5/2014 | Ryu ................... H01L 27/10876 257/316 |
| 2014/0193961 A1* | 7/2014 | Tzeng ................. H01L 23/5223 438/396 |
| 2015/0206883 A1* | 7/2015 | Lee ................... H01L 27/10814 257/773 |
| 2015/0214289 A1* | 7/2015 | Kim ...................... H01L 21/311 438/387 |
| 2015/0357399 A1* | 12/2015 | Cho .................. H01L 21/02192 257/532 |
| 2016/0073488 A1* | 3/2016 | Stuart ...................... G21G 4/06 315/506 |

* cited by examiner

Primary Examiner — Marcos D Pizarro
Assistant Examiner — Shannon Yi
(74) Attorney, Agent, or Firm — Wells St. John P.S.

(57) ABSTRACT

A capacitor includes an elevationally inner capacitor electrode, an elevationally outer capacitor electrode, and capacitor insulator between the elevationally inner and outer capacitor electrodes. The elevationally inner capacitor electrode comprises a hollow longitudinally-elongated conductive cylinder-like portion and a non-hollow longitudinally-elongated conductive cylinder-like portion electrically coupled with the hollow cylinder-like portion. The non-hollow cylinder-like portion is radially of and extends longitudinally along a longitudinal side surface of the hollow cylinder-like portion. Additional embodiments and aspects are disclosed.

15 Claims, 12 Drawing Sheets

CAPACITOR, ARRAY OF CAPACITORS, AND DEVICE COMPRISING AN ELECTRODE

TECHNICAL FIELD

Embodiments disclosed herein pertain to capacitors, to arrays of capacitors, and to devices comprising an electrode.

BACKGROUND

Capacitors are one type of component used in the fabrication of integrated circuits, for example in DRAM and other memory circuitry. A capacitor is comprised of two conductive electrodes separated by a non-conducting insulator region. As integrated circuitry density has increased, there is a continuing challenge to maintain sufficiently high storage capacitance despite decreasing capacitor area. The increase in density has typically resulted in greater reduction in the horizontal dimension of capacitors as compared to the vertical dimension. In many instances, the vertical dimension of capacitors has increased.

One manner of fabricating capacitors is to initially form an insulative or other support material within which a capacitor storage electrode is formed. For example, an array of capacitor electrode openings for individual capacitors may be fabricated in an insulative support material, with an example material being silicon dioxide doped with one or both of phosphorus and boron. Openings within which some or all of the capacitors are formed are etched into the support material. Conductive material is deposited to line and less-than-fill the individual openings. The conductive material may be planarized or etched back relative to the support material to form individual elevationally inner capacitor electrodes within individual of the openings. In some methods, most if not all of the support material is then etched away to enable the radially outer as well as the radially inner sidewall surfaces of the electrodes to provide capacitor surface area and thereby increased capacitance for the capacitors being formed. Yet, capacitor electrodes formed in deep openings are often correspondingly much taller than they are wide. This can lead to toppling of the capacitor electrodes during etching to expose the outer sidewall surfaces, during transport of the substrate, during deposition of the capacitor insulator material, and/or during deposition of the outer capacitor electrode material. Brace or lattice-like retaining structures have been proposed and used to alleviate such toppling.

Still, capacitors continue to be packed horizontally closer together. This may be facilitated by making the lateral or radial thicknesses of the elevationally inner capacitor electrodes ever thinner. This may diminish their structural integrity to the point of requiring that some or all of the support material remain radially outward of the electrodes for them to survive subsequent processing. Accordingly, only some or none of the radially outer surfaces of such capacitor electrodes are covered by the capacitor insulator between the elevationally inner and outer electrodes, resulting in loss of capacitive surface area and capacitance. Capacitance reduced thereby may be compensated for by making the capacitors taller. This may, however, lead to increased electrical resistance from the bottom of the individual capacitor electrodes to their tops due to the thinner radial/lateral thickness of the conductive material from which the capacitor electrodes are formed. Such can result in read/write characteristics of the capacitor being degraded

DETAILED DESCRIPTION OF EXAMPLE EMBODIMENTS

A capacitor in accordance with an embodiment of the invention is initially described with reference to FIGS. 1-4. Such show a substrate fragment 10 (FIGS. 1 and 2) comprising a capacitor 12 that has been fabricated over a base substrate 14. Base substrate 14 may comprise any one or more of conductive (i.e., electrically herein), semiconductive, or insulative/insulator (i.e., electrically herein) material(s). An insulative material 16 (e.g., silicon dioxide) is shown received circumferentially about capacitor 12 over base substrate 14. Materials may be aside, elevationally inward, or elevationally outward of the FIGS. 1 and 2—depicted materials. For example, other partially or wholly fabricated components of integrated circuitry may be provided somewhere about or within fragment 10. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Figure 3:
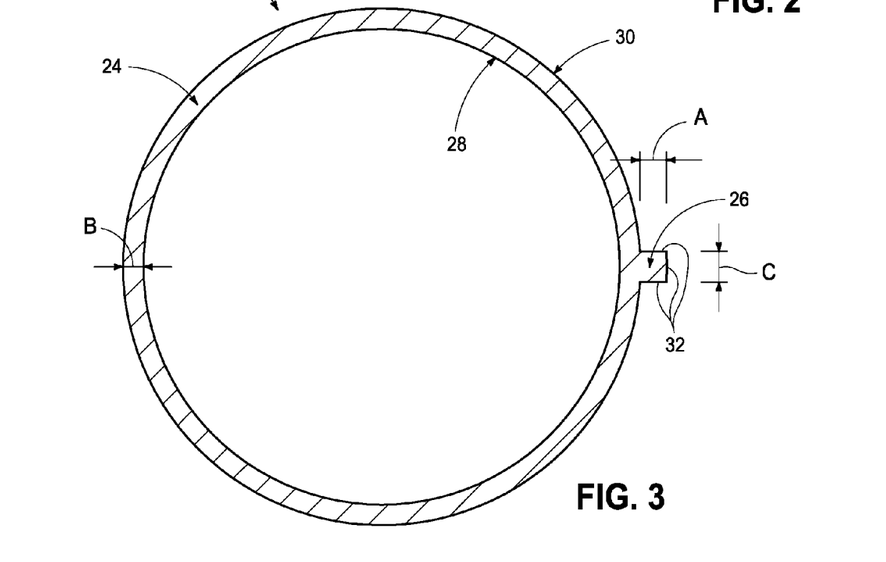
FIG. 3 is an enlarged sectional view of only one component of the substrate fragment as shown in FIG. 1.
Figure 4:
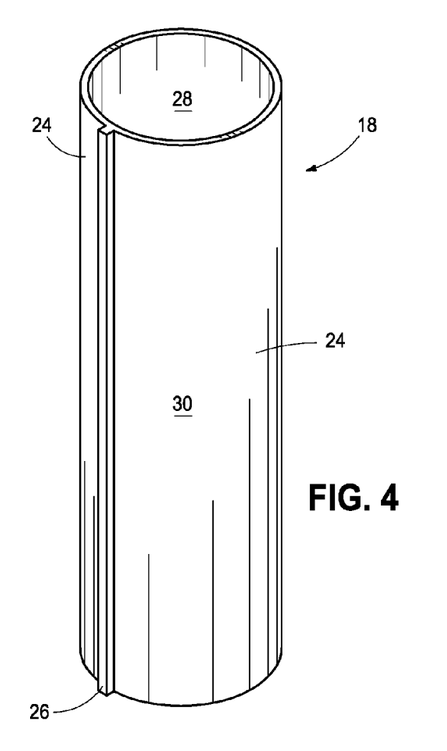
FIG. 4 is a diagrammatic perspective view of the one component shown in FIG. 3.

Capacitor 12 comprises an elevationally inner capacitor electrode 18, an elevationally outer capacitor electrode 20, and capacitor insulator 22 there-between. In this document, "elevational", "upper", "lower", "top", "bottom", and "beneath" are generally with reference to the vertical direction. "Horizontal" refers to a general direction (i.e., within 10 degrees) along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space. FIGS. 3 and 4 only show elevationally inner capacitor electrode 18 for emphasis, with other materials and components in FIGS. 1 and 2 not being shown in FIGS. 3 and 4 for clarity. Capacitor electrodes 18 and 20 may comprise the same conductive material(s) or may comprise different conductive material(s). Any suitable conductive material may be used such as one or more elemental metal(s), an alloy of two or more elemental metals, conductive metal compounds, and/or conductively doped semiconductive material(s). One specific example is TiN. Elevationally outer capacitor electrode 20 may completely fill internal volume of void space defined by elevationally inner capacitor electrode 18 as shown, or may less-than-fill such void space (not shown). Any suitable insulative material may be used for capacitor insulator 22, such as silicon dioxide, silicon nitride, dielectric metal oxides, and ferroelectric metal oxides.

In one embodiment, elevationally inner capacitor electrode 18 comprises a hollow longitudinally-elongated conductive cylinder-like portion 24 and a non-hollow longitudinally-elongated conductive cylinder-like portion 26 that is electrically coupled with hollow cylinder-like portion 24. In this document, devices/materials/components are "electrically coupled" relative one another if in normal operation electric current is capable of continuously flowing from one to the other, and does so predominately by movement of subatomic positive and/or negative charges when such are sufficiently generated. Conductive cylinder-like portion 24 and conductive cylinder-like portion 26 may be of the same composition or of different composition relative one another. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", "adjacent", "along", and "against" not preceded by "directly" encompass "directly against" as well as construction where intervening material(s) or structure(s) result(s) in no physical touching contact of the stated materials or structures relative one another.

Elevationally inner capacitor electrode 18 comprises a longitudinal side surface 28 and a longitudinal side surface 30 (FIGS. 3 and 4). Surface 28 comprises a radially inner longitudinal side surface and surface 30 comprises a radially outer longitudinal side surface. Non-hollow cylinder-like portion 26 is radially of and extends longitudinally along a longitudinal side surface 28, 30 of hollow conductive cylinder-like portion 24. In one embodiment and as shown, non-hollow cylinder-like portion 26 is radially outward of radially outer longitudinal side surface 30. Alternately or additionally, the non-hollow cylinder-like portion could be radially inward (not shown) of radially inner longitudinal side surface 28. In one such embodiment, capacitor insulator 22 is radially over and directly against (not shown) non-hollow cylinder-like portion 26. Regardless, in one embodiment, conductive material of hollow cylinder-like portion 24 is directly against conductive material of non-hollow cylinder-like portion 26. Alternately as an example, conductive materials of the hollow and non-hollow cylinder-like portions may not be directly against one another, for example being radially spaced relative one another (not shown).

In one embodiment where conductive material of hollow cylinder-like portion 24 is directly against conductive material of non-hollow cylinder-like portion 26, non-hollow cylinder-like portion 26 projects radially relative to one of radially inner or outer longitudinal side surfaces 28 and 30 (e.g., surface 30 as shown). In one such embodiment, such projects radially a distance A that is at least equal, and in one embodiment as shown that is greater than, a radial thickness B of conductive material of hollow cylinder-like portion 24 between radially inner and outer longitudinal side surfaces 28 and 30, respectively. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable.

In one embodiment, non-hollow cylinder-like portion 26 has a straight-line width C relative to the circumference of hollow cylinder-like portion 24 that is greater than radial thickness B. In one embodiment, straight-line width C is less than two times radial thickness B, and in one embodiment no greater than 1.5 times radial thickness B. In one embodiment, non-hollow cylinder-like portion 26 in horizontal cross-section has a straight side surface, in one embodiment at least two such surfaces, and in one embodiment at least three such surfaces, with three straight side surfaces 32 (FIG. 3) being shown.

In one embodiment, non-hollow cylinder-like portion 26 extends along at least 50% of a length L of a longitudinal side surface of hollow cylinder-like portion 24. In one such embodiment, portion 26 extends along at least 80% of length L, and in one embodiment and as shown along all of length L.

Figure 5:
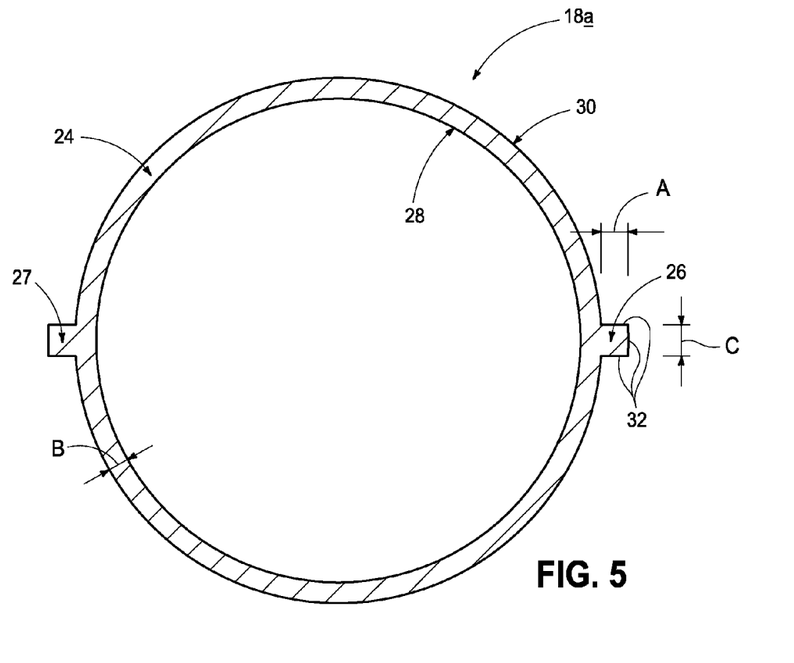
FIG. 5 is a view of an alternate embodiment to the one component shown in FIG. 3.
Figure 33:
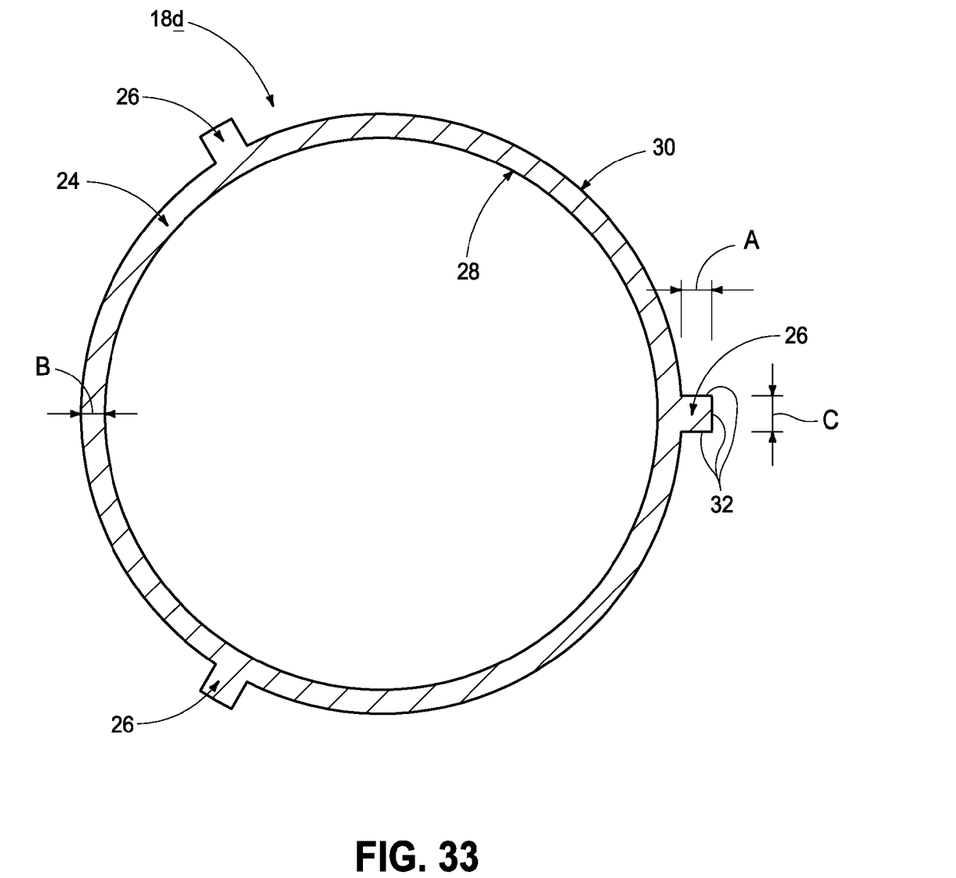
FIG. 33 is a view of an alternate embodiment to the one component shown in FIG. 3.

FIGS. 1-4 show an example embodiment capacitor comprising only a single non-hollow longitudinally elongated conductive cylinder-like portion 26. An alternate example embodiment is shown in FIG. 5 with respect to an elevationally inner capacitor electrode 18*a*. Like numerals from the above-described embodiment have been used where appropriate, with some construction differences being indicated with the suffix "a" or with different numerals. Elevationally inner capacitor electrode 18*a* is shown as comprising multiple (i.e., at least two) non-hollow conductive cylinder-like portions 26, 27 and which are circumferentially spaced relative one another and hollow cylinder-like portion 24. In one such embodiment and as shown, two of such non-hollow cylinder-like portions 26, 27 are diametrically opposed to one another. Alternate configurations, are of course contemplated, including more than two non-hollow cylinder-like portions (e.g., inner capacitor electrode 18*d* in FIG. 33) and regardless of whether such are on the same or different radial sides (i.e., inside or outside) of hollow cylinder-like portion 24. Regardless, the multiple non-hollow conductive cylinder-like portions individually may be of the same or different size(s), shape(s), and/or construction(s) relative one another. Any other attribute(s) or aspect(s) as shown and/or described above may be used.

Figures 1, 2:
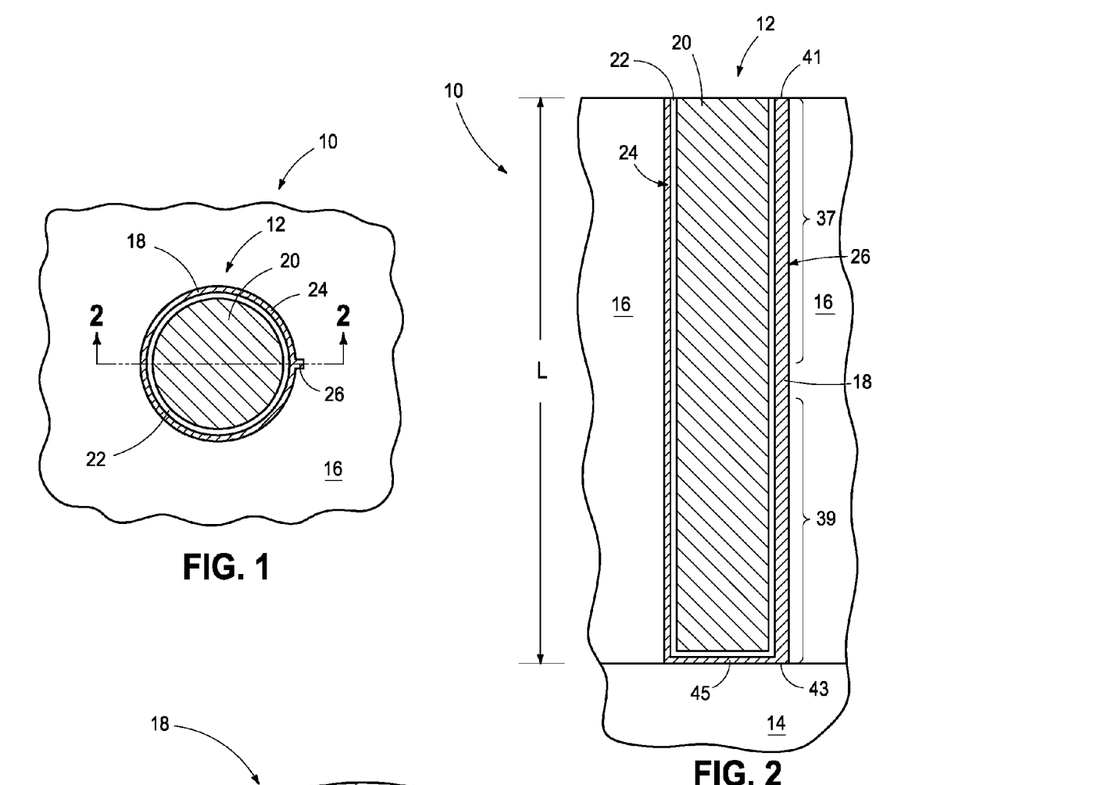
FIG. 1 is a diagrammatic top view of a substrate fragment comprising a capacitor in accordance with an embodiment of the invention.
FIG. 2 is a diagrammatic sectional view taken through line 2-2 in FIG. 1.

Embodiments of the invention also encompass a device comprising an electrode. An example such device is a capacitor with the electrode comprising a capacitor electrode, although other devices which are not capacitors are also contemplated. In such embodiment, the electrode, such as an electrode 18/18*a*, comprises a cup-shaped portion 24 including a radially outer surface 30, a radially inner surface 28, a top portion 37 (FIG. 2), a bottom portion 39 (FIG. 2), and a base 45 (FIG. 2). Electrode 18/18*a* also includes a projected portion 26 and/or 27 (i.e., regardless of whether non-hollow) protruding radially from radially outer surface 30 of cup-shaped portion 24 and extending from top portion 37 of cup-shaped portion 24 to bottom portion 39 of cup-shaped portion 24. In one embodiment and as shown, projected portion 26 and/or 27 extends to a top 41 of top portion 37, and in one embodiment extends to a bottom 43 of bottom portion 39. Regardless, in one embodiment projected portion 26 extends along at least 80% of length L of cup-shaped portion 24, and in one embodiment along all of length L. Any other attribute(s) or aspect(s) as described above and/or shown in FIGS. 1-5 may be used.

Figure 29:
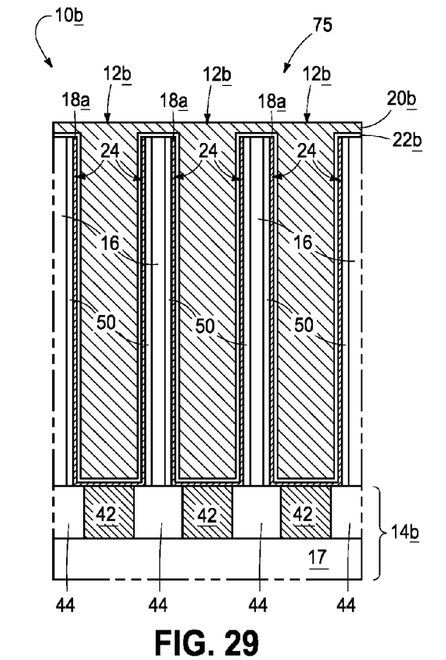
FIG. 29 is a view of the FIG. 27 substrate at a processing step subsequent to that shown by FIG. 27.
Figure 30:
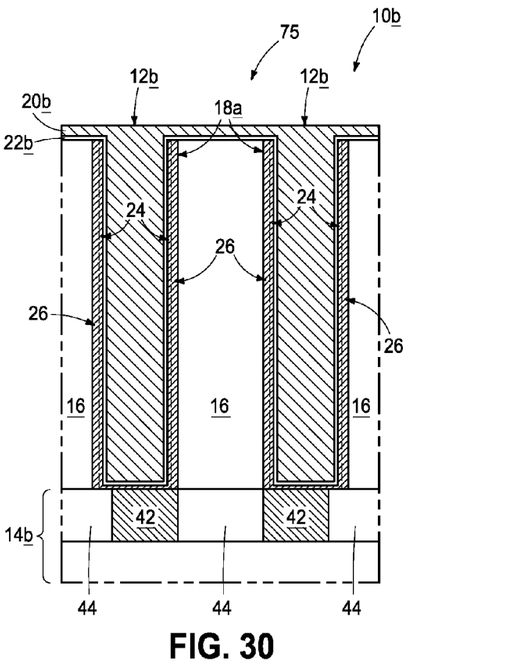
FIG. 30 is a view of the FIG. 28 substrate at a processing step subsequent to that shown by FIG. 28, and corresponds in processing sequence to that of FIG. 29.

Embodiments of the invention encompass an array of capacitors, for example comprising a plurality of any one of more of the capacitor designs as described above. One example such array 75 is shown in FIGS. 29 and 30, and is further described below.

A method embodiment of the invention of forming an array of capacitors comprising the embodiment of FIG. 5 is next described with reference to FIGS. 6-30. Like numerals from the above-described embodiments for like materials and constructions are used where appropriate, with some construction differences and additions being indicated with different numerals or the suffix "b". In FIGS. 6-30, the sectional views are shown at 25% reduced scale compared to the top views both for clarity in the top views and to fit the sectional views for the same processing step on the same page as the top view.

Figure 6:
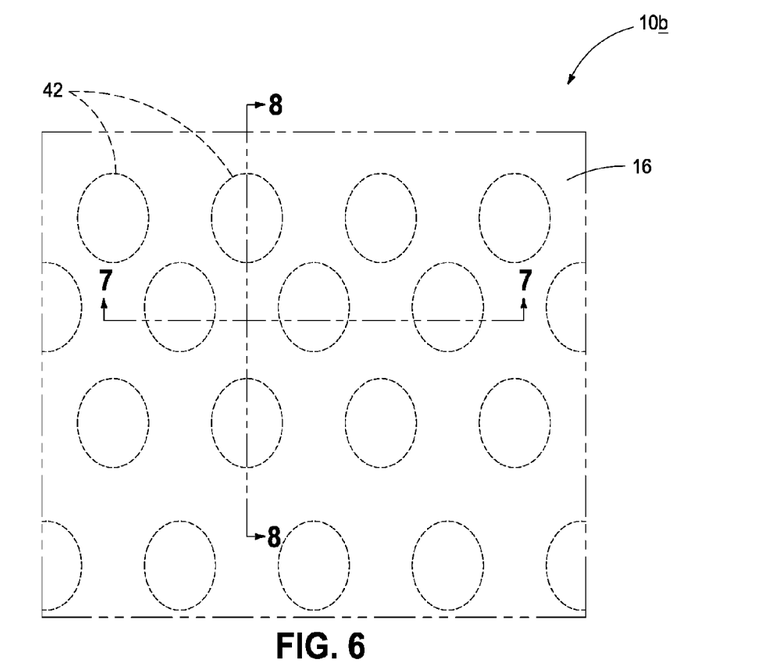
FIG. 6 is a diagrammatic top view of a substrate fragment in process in accordance with an embodiment of the invention.
Figure 7:
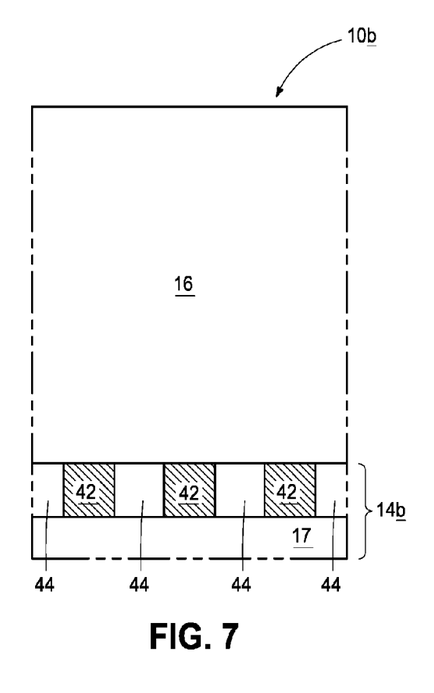
FIG. 7 is a diagrammatic reduced-scale sectional view taken through line 7-7 in FIG. 6.
Figure 8:
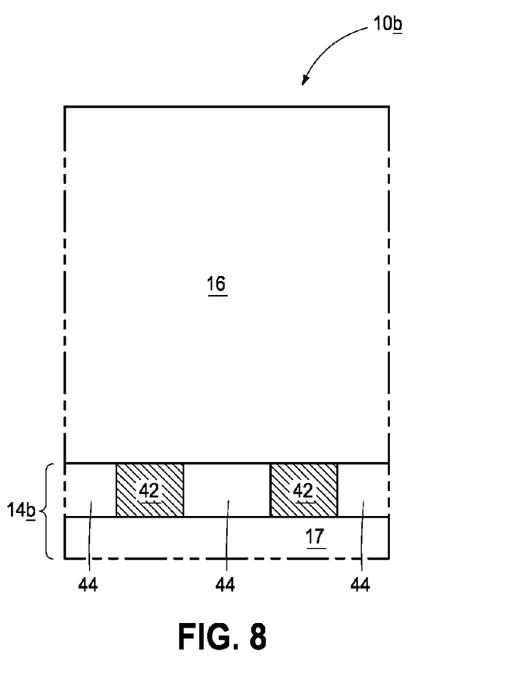
FIG. 8 is a diagrammatic reduced-scale sectional view taken through line 8-8 in FIG. 6.

Referring to FIGS. 6-8, substrate fragment 10*b* has a base substrate 14*b* comprising substrate material 17 having insulative material 44 there-over. In one embodiment, elevationally-extending conductive conduits 42 extend upwardly from substrate material 17 through insulative material 44. Substrate material 17 may comprise semiconductor material (e.g., monocrystalline silicon), thereby rendering base substrate 14*b* and substrate fragment 10*b* as being a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Insulative material 44 may comprise any suitable insulative material as described above. Conductive conduits 42 may be of any suitable horizontal cross-sectional shape(s) (e.g., circular, square, rectangular, ellipsoidal, etc.), with example ellipses being shown. As will be apparent from the continuing discussion and in one embodiment, conductive conduits 42 will be elevationally inward of and to which elevationally inner capacitor electrodes of individual capacitors within the array will electrically couple. Conductive conduits 42 may extend elevationally inward to electrically couple with access devices (e.g., diodes, source/drain regions of transistors, etc.), for example if formed as part of an array of memory cells such as DRAM or other memory.

Figure 9:
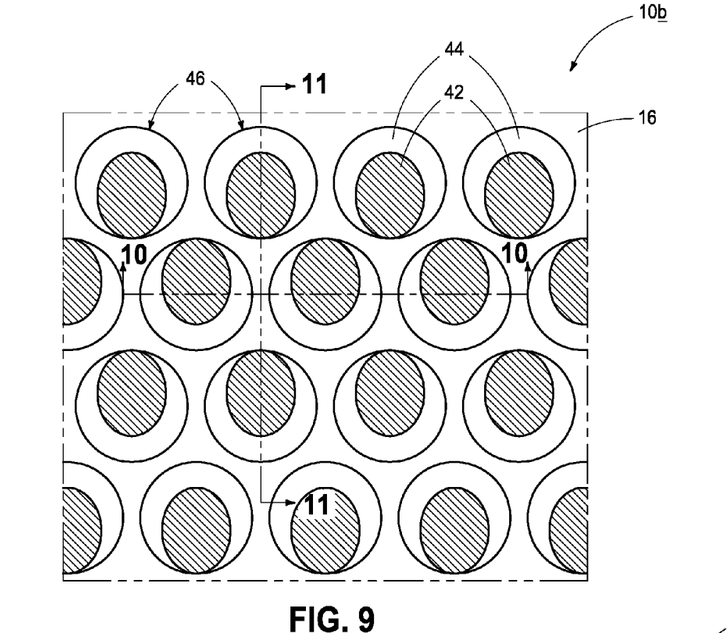
FIG. 9 is a view of the FIG. 6 substrate at a processing step subsequent to that shown by FIG. 6.
Figure 10:
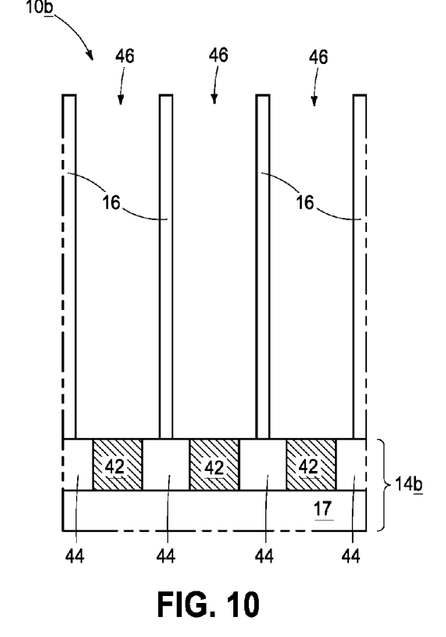
FIG. 10 is a diagrammatic reduced-scale sectional view taken through line 10-10 in FIG. 9.
Figure 11:
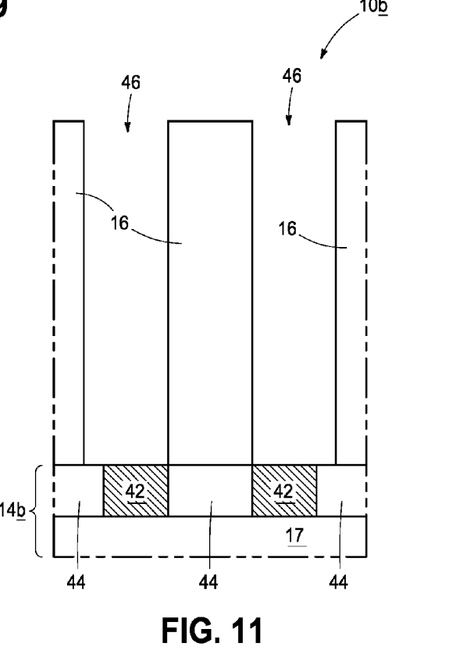
FIG. 11 is a diagrammatic reduced-scale sectional view taken through line 11-11 in FIG. 9.

Referring to FIGS. 9-11, openings 46 for individual elevationally inner capacitor electrodes have been formed through insulative material 16 to conductive conduits 42. In one embodiment and as shown, openings 46 are arranged in a 2D hexagonal lattice pattern (i.e., a Bravais lattice of one type) whereby the resulting elevationally inner capacitor electrodes of the array of capacitors may also be arranged in a 2D hexagonal lattice pattern. In one embodiment, openings 46 are formed to be circular in horizontal cross-section, although any shape may be used. Horizontal cross-sectional sizes and/or shapes of openings 46 and conductive conduits 42 may be the same or different, with different sizes and shapes being shown. In but one example, an example maximum open diameter of individual openings 46 is 512 Angstroms, an example minimum separation distance between immediately adjacent openings 46 is 50 Angstroms, and thereby providing a minimum pitch of 562 Angstroms along the primitive vectors spanning the lattice. Alternate configurations may of course be used.

Figure 12:
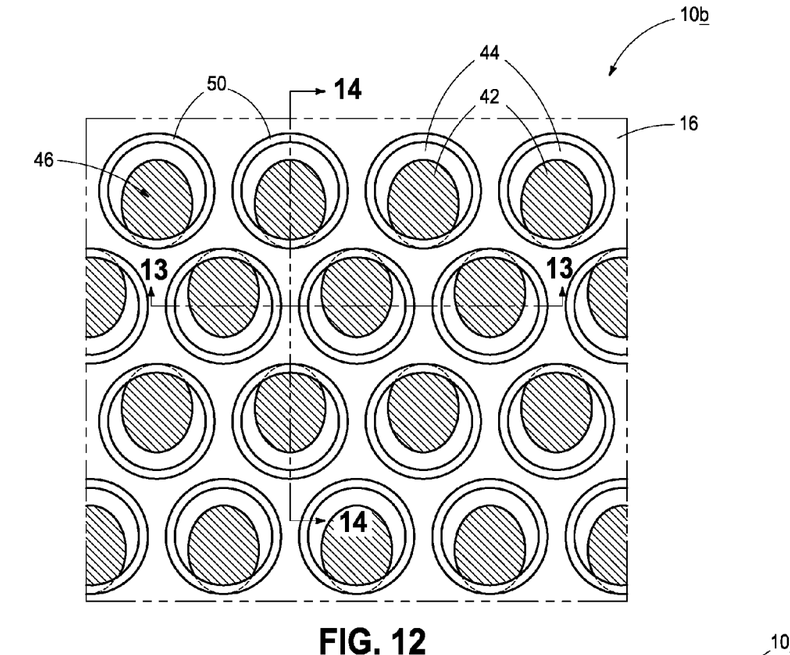
FIG. 12 is a view of the FIG. 9 substrate at a processing step subsequent to that shown by FIG. 9.
Figure 13:
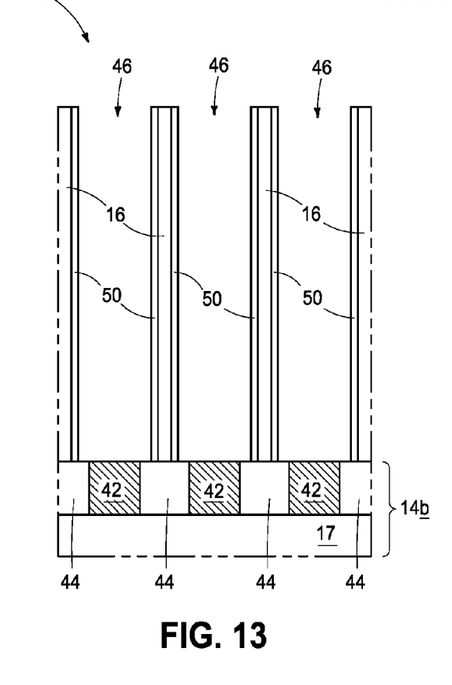
FIG. 13 is a diagrammatic reduced-scale sectional view taken through line 13-13 in FIG. 12.
Figure 14:
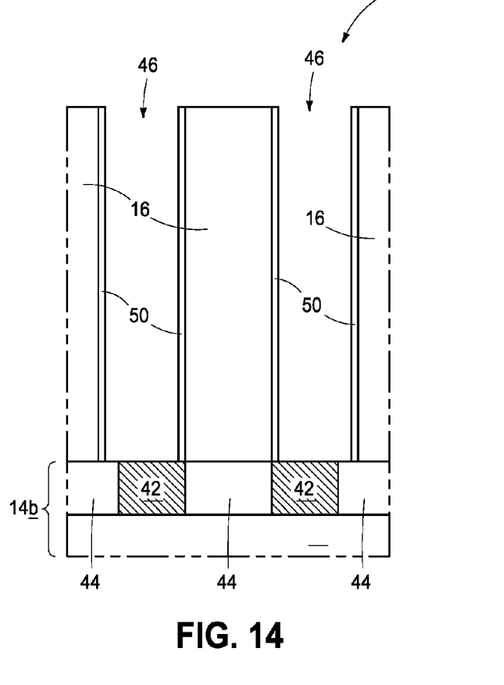
FIG. 14 is a diagrammatic reduced-scale sectional view taken through line 14-14 in FIG. 12.

Referring to FIGS. 12-14, an insulative spacer material 50 has been deposited over insulative material 16 to line and less-than-fill openings 46. This has been followed by an anisotropic etch of material 50 to remove such from being over horizontal surfaces to leave material 50 along sidewalls of openings 46 as shown. Insulative spacer material 50 is ideally of a different composition from that of insulative material 16, and an example deposition thickness is 50 Angstroms.

Figure 15:
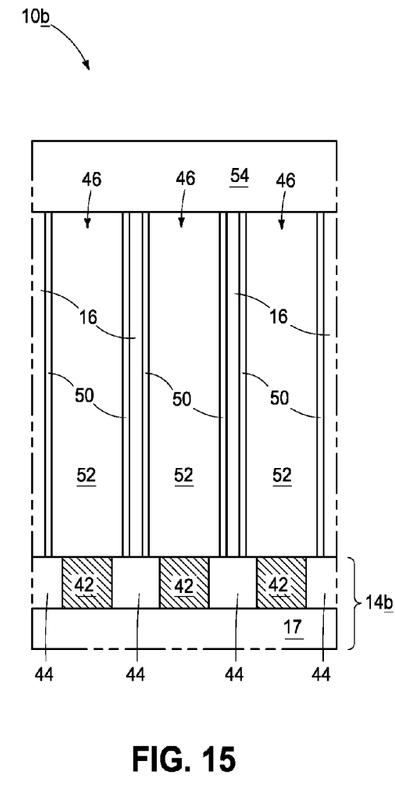
FIG. 15 is a view of the FIG. 13 substrate at a processing step subsequent to that shown by FIG. 13.
Figure 16:
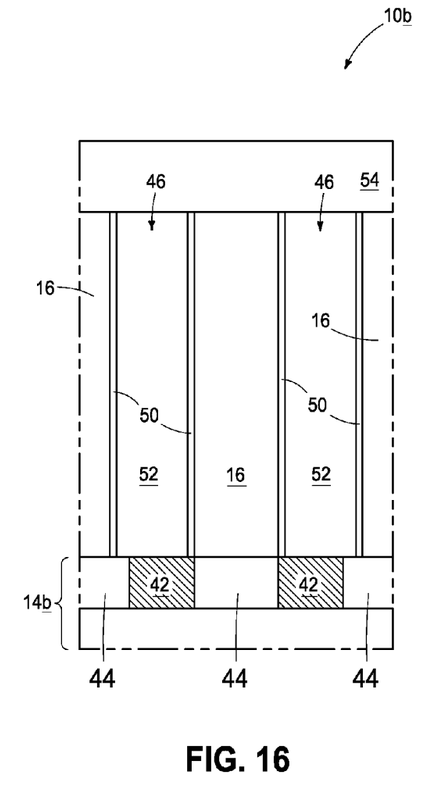
FIG. 16 is a view of the FIG. 14 substrate at a processing step subsequent to that shown by FIG. 14, and corresponds in processing sequence to that of FIG. 15.

Referring to FIGS. 15 and 16, first and second masking materials 52 and 54, respectively, have been formed as part of substrate fragment 10. First masking material 52 has been deposited to overfill remaining volume of openings 46, followed by a polish or etch-back thereof at least to the elevationally outermost surfaces of materials 50 and 16. Second masking material 54 has been subsequently deposited thereover. Masking materials 52 and 54 may be of the same or different compositions relative one another, with organic materials being examples.

Figure 17:
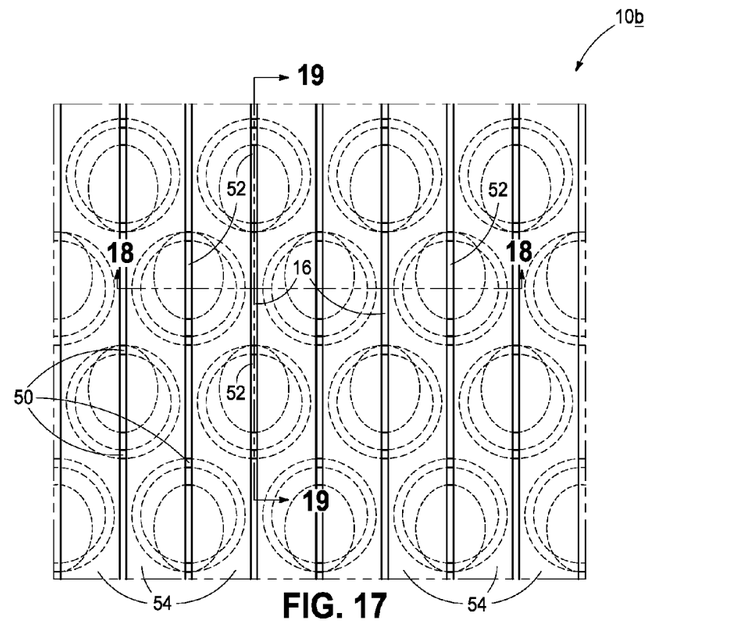
FIG. 17 is a view of the FIG. 12 substrate at a processing step subsequent to that shown by FIGS. 15 and 16.
Figure 18:
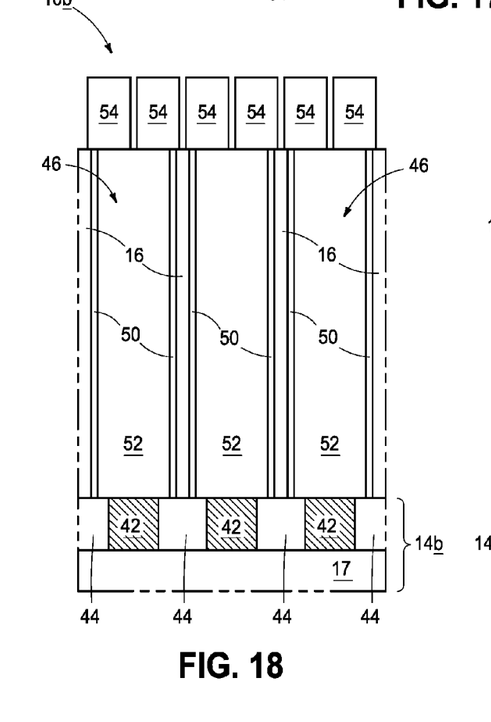
FIG. 18 is a diagrammatic reduced-scale sectional view taken through line 18-18 in FIG. 17.
Figure 19:
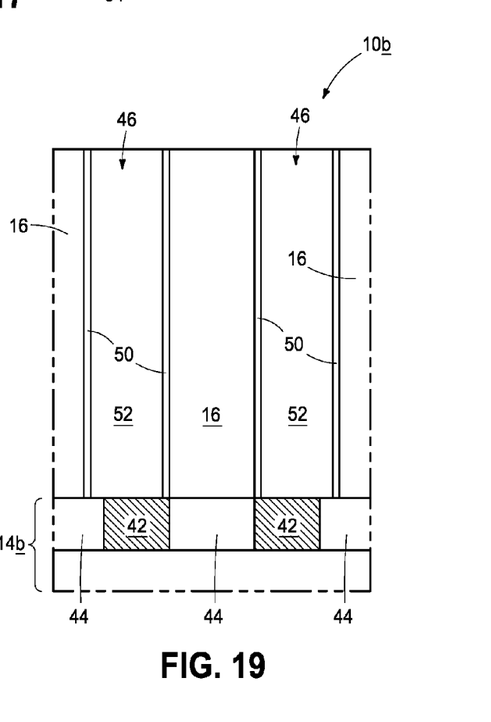
FIG. 19 is a diagrammatic reduced-scale sectional view taken through line 19-19 in FIG. 17.

Referring to FIGS. 17-19, second masking material 54 has been patterned into a line and space pattern to arrange periodically in the vertical direction represented in FIG. 17. In one embodiment, the line and space pattern has a pitch which is equal to the half-pitch of openings 46 as formed and described above with respect to FIGS. 9-11. Accordingly in the above specific example, such a half-pitch would be 281 Angstroms, with the individual spaces between second masking material 54 having a maximum width of 50 Angstroms. In one example embodiment and as shown, the spaces pass diametrically through the center of each opening 46 and between immediately adjacent openings 46 in alternating rows of openings 46.

Figure 20:
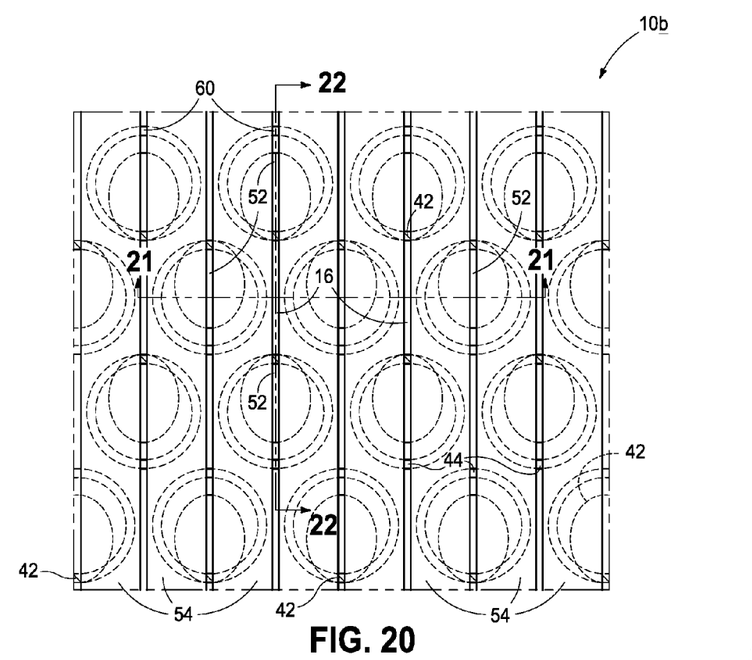
FIG. 20 is a view of the FIG. 17 substrate at a processing step subsequent to that shown by FIG. 17.
Figure 21:
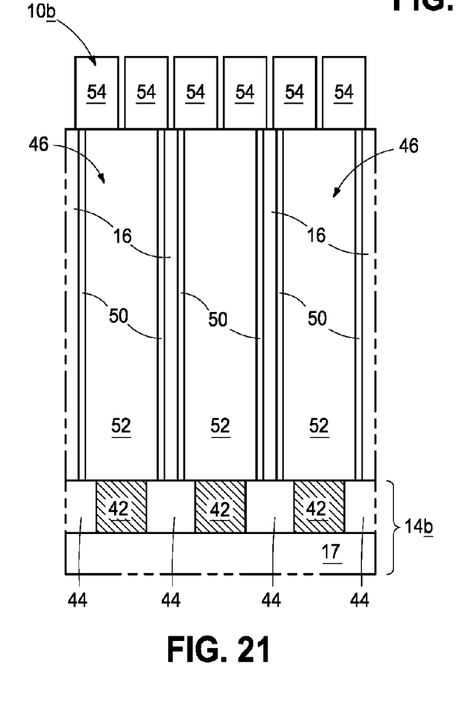
FIG. 21 is a diagrammatic reduced-scale sectional view taken through line 21-21 in FIG. 20.
Figure 22:
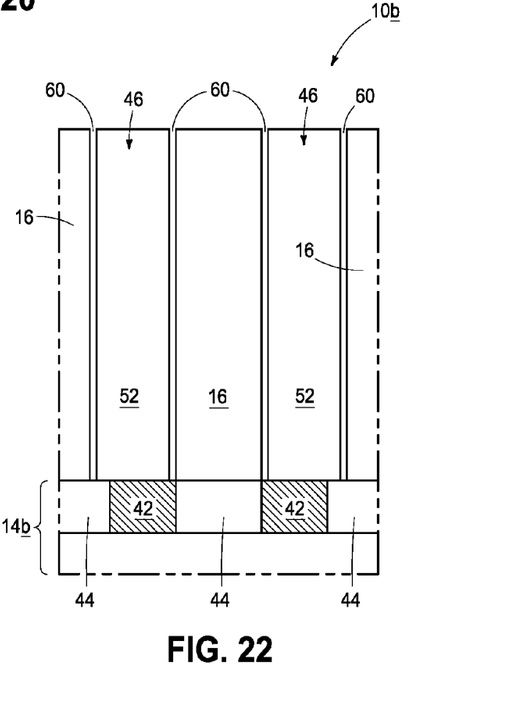
FIG. 22 is a diagrammatic reduced-scale sectional view taken through line 22-22 in FIG. 20.

Referring to FIGS. 20-22, the exposed portions of spacer material 50 have been anisotropically etched selectively relative to masking materials 52 and 54 and relative to insulative material 16 to form openings 60 elevationally through spacer material 50 to conductive conduits 42 and insulative material 44. Spacer material 50 may be divided into two symmetrical half circle-like portions as shown.

Figure 23:
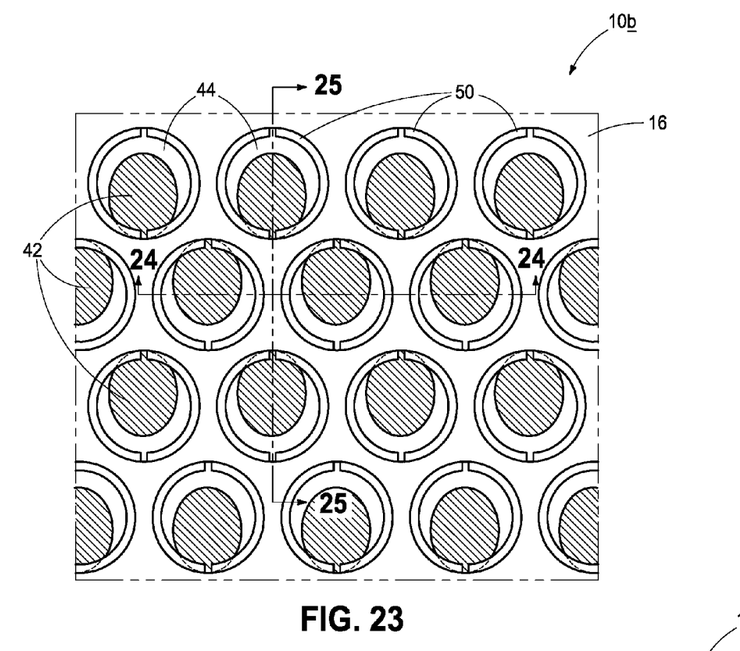
FIG. 23 is a view of the FIG. 20 substrate at a processing step subsequent to that shown by FIG. 20.
Figure 24:
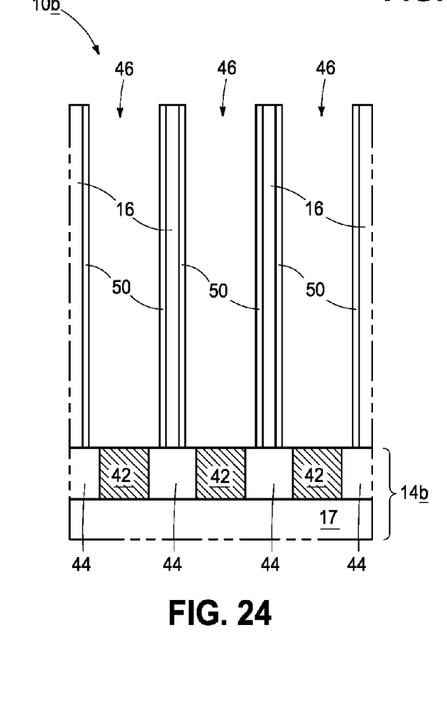
FIG. 24 is a diagrammatic reduced-scale sectional view taken through line 24-24 in FIG. 23.
Figure 25:
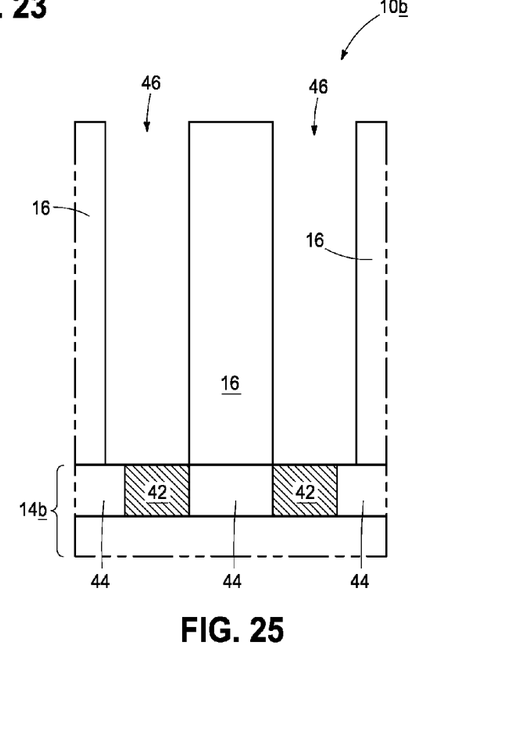
FIG. 25 is a diagrammatic reduced-scale sectional view taken through line 25-25 in FIG. 23.

Referring to FIGS. 23-25, masking materials 52 and 54 (not shown) have been removed, thereby ideally exposing more of individual conductive conduits 42.

Figure 26:
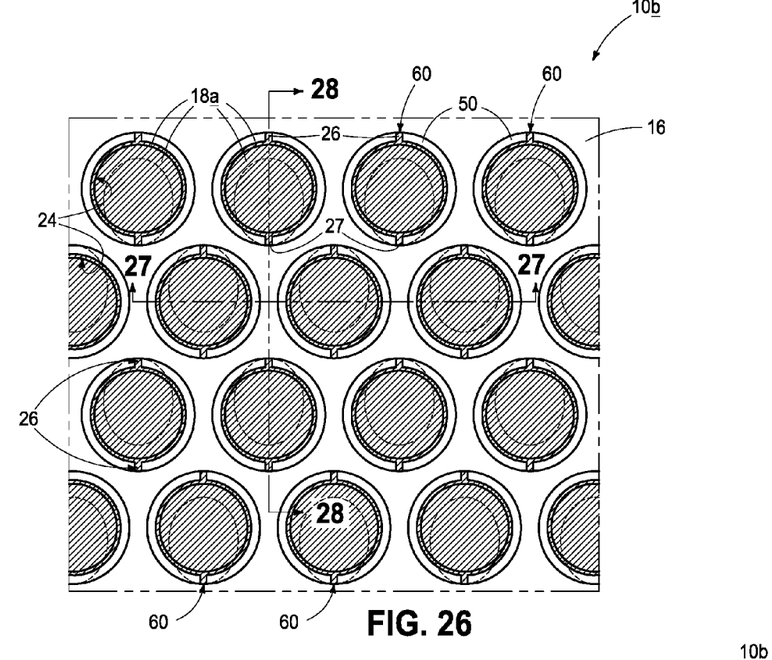
FIG. 26 is a view of the FIG. 23 substrate at a processing step subsequent to that shown by FIG. 23.
Figure 27:
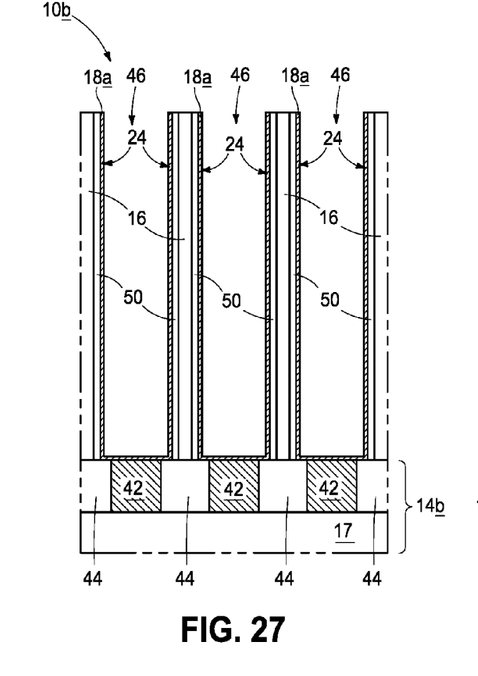
FIG. 27 is a diagrammatic reduced-scale sectional view taken through line 27-27 in FIG. 26.
Figure 28:
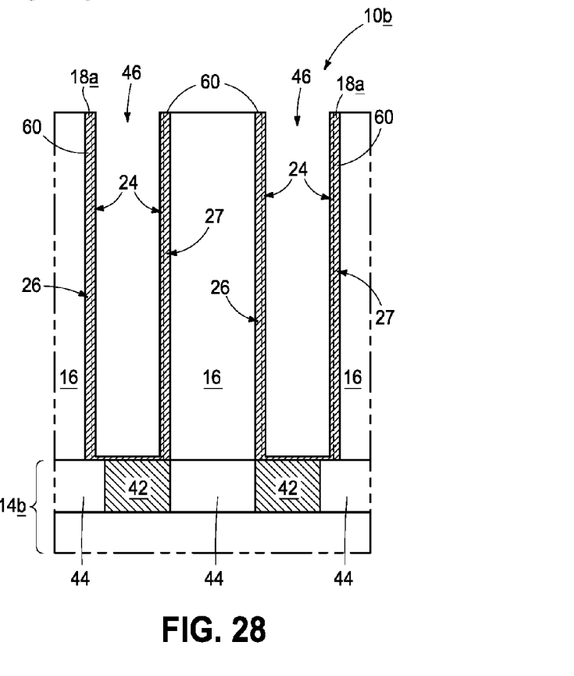
FIG. 28 is a diagrammatic reduced-scale sectional view taken through line 28-28 in FIG. 26.

Referring to FIGS. 26-28, conductive material has been deposited to line and less-than-fill-remaining volume of openings 46 and to completely fill openings 60, followed by a polish back at least to the elevationally outermost surfaces of materials 16 and 50, thereby forming elevationally inner capacitor electrodes 18a within individual openings 46. In one embodiment and as shown, elevationally inner capacitor electrodes 18a individually electrically couple to individual conductive conduits 42 there-beneath.

Accordingly in the depicted embodiment, elevationally inner capacitor electrodes 18a individually comprise a hollow longitudinally-elongated conductive cylinder-like portion 24 and a pair of non-hollow longitudinally-elongated conductive cylinder-like portions 26, 27 which electrically couple with hollow cylinder-like portion 24. Non-hollow cylinder-like portions 26, 27 are radially of and extend longitudinally along one of two diametrically opposed longitudinal sides of hollow cylinder-like portion 24. In one embodiment and as shown, elevationally inner capacitor electrodes 18a are arranged in a 2D hexagonal lattice pattern. In one such embodiment and as shown, conductive conduits 42 are not arranged in any 2D Bravais lattice pattern (i.e., are not arranged in an infinite array of discrete points generated by a set of discrete translation operations defined by $R = n_1 a_1 + n_2 a_2$, where $n_1$ and $n_2$ are any integers and $a_1$ and $a_2$ are the primitive vectors which lie in different directions and span the lattice; see, for example, FIG. 6 wherein the ellipses are not in any 2D Bravais lattice pattern).

In one embodiment and as shown, one of non-hollow cylinder-like portions 26, 27 of the pair of such cylinder-like portions is directly against an individual of conduits 42. In one such embodiment, the other of the non-hollow cylinder-like portions 26 or 27 of the pair is not directly against such individual conduit 42.

Referring to FIGS. 29 and 30, capacitor insulator 22b has been deposited over elevationally inner capacitor electrodes 18a. Subsequently, a conductive material has been deposited to form an elevationally outer capacitor electrode 20b common to the individual elevationally inner capacitor electrodes 18a. Thereby, an array 75 of capacitors 12b has been formed and as well is shown and may be considered independent of method of manufacture.

Figure 31:
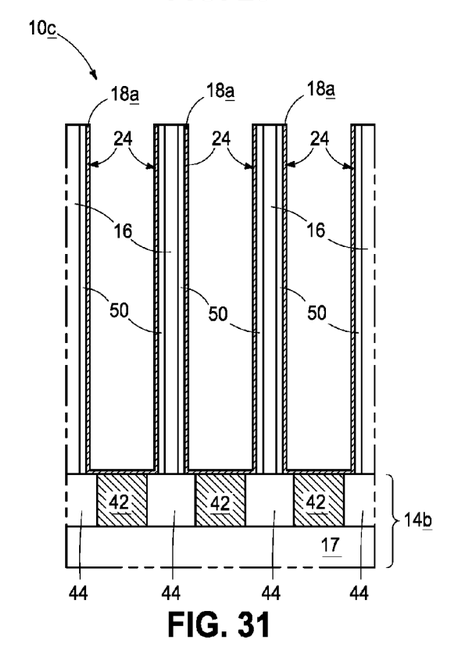
FIGS. 31 and 32 show an alternate embodiment to that shown by FIGS. 27 and 28, respectively.
Figure 32:
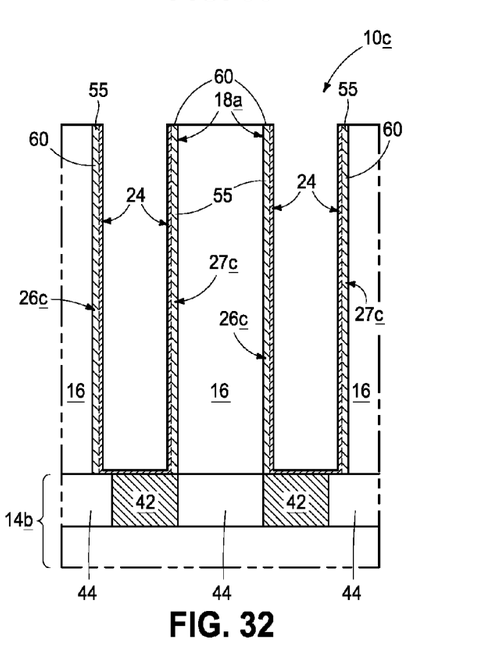

FIGS. 31 and 32 show an alternate embodiment substrate fragment 10c just prior to deposition of the capacitor insulator and outer capacitor electrode materials. Like numerals from the above-described embodiments have been used where appropriate, with some differences being indicated with the suffix "c". Fragment 10c is shown as forming non-hollow cylinder-like portions 26c and 27c as comprising a different conductive material 55 from that of hollow cylinder-like portions 24. Such might be formed by filling openings 60 with conductive material 55 immediately after their formation, followed by deposition of conductive material of portion 24 after removal of masking material 52. Alternately, as an example, conductive material portions 26c and 27c could be masked in FIGS. 26-28 and conductive material of portions 24 anisotropically etched away. Then, a different conductive composition for portions 24 could be deposited.

The above embodiments described with reference to FIGS. 6-32, by way of example only, formed a capacitor in accordance with the above-described FIG. 5 embodiment. Alternately as an example, an array of capacitors may be formed wherein individual of the elevationally inner capacitor electrodes individually comprise a construction as shown in the FIGS. 1-4 embodiment, or any other capacitor embodiments in accordance with this disclosure.

CONCLUSION

In some embodiments, a capacitor comprises an elevationally inner capacitor electrode, an elevationally outer capacitor electrode, and capacitor insulator between the elevationally inner and outer capacitor electrodes. The elevationally inner capacitor electrode comprises a hollow longitudinally-elongated conductive cylinder-like portion and a non-hollow longitudinally-elongated conductive cylinder-like portion electrically coupled with the hollow cylinder-like portion. The non-hollow cylinder-like portion is radially of and extends longitudinally along a longitudinal side surface of the hollow cylinder-like portion.

In some embodiments, a device comprises an electrode that comprises a cup-shaped portion including a radially outer surface, a radially inner surface, a top portion, and a bottom portion. A projected portion protrudes radially from the radially outer surface of the cup-shaped portion and extends from the top portion of the cup-shaped portion to the bottom portion of the cup-shaped portion.

In some embodiments, an array of capacitors comprises an array of elevationally inner capacitor electrodes of individual of the capacitors. The array also comprises an elevationally outer capacitor electrode common to the individual elevationally inner capacitor electrodes. A capacitor insulator is between the elevationally inner and outer capacitor electrodes. The elevationally inner capacitor electrodes individually comprise a hollow longitudinally-elongated conductive cylinder-like portion and a pair of non-hollow longitudinally-elongated conductive cylinder-like portions electrically coupled with the hollow cylinder-like portion. The non-hollow cylinder-like portions are radially of and extend longitudinally along one of two diametrically opposed longitudinal sides of the hollow cylinder-like portion.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of capacitors comprising:
    an array of lower capacitor electrodes of individual of the capacitors, the lower capacitor electrodes being arranged in a 2D Bravais hexagonal lattice pattern; an upper capacitor electrode common to the individual lower capacitor electrodes; and capacitor insulator between the lower and upper capacitor electrodes; the lower capacitor electrodes individually comprising:
        a hollow longitudinally-elongated conductive cylinder-like portion; and
        a pair of non-hollow longitudinally-elongated conductive cylinder-like portions electrically coupled with the hollow cylinder-like portion, the non-hollow cylinder-like portions being radially of and extending longitudinally along one of two diametrically opposed longitudinal sides of the hollow cylinder-like portion; and
    elevationally-extending conductive conduits beneath and to which the lower capacitor electrodes individually electrically couple, the conduits not being arranged in any 2D Bravais lattice pattern.

2. An array of capacitors of claim 1 wherein the non-hollow cylinder-like portions extend longitudinally all along one of the two diametrically opposed longitudinal sides of the hollow cylinder-like portion.

3. An array of capacitors comprising:
    an array of lower capacitor electrodes of individual of the capacitors; an upper capacitor electrode common to the individual lower capacitor electrodes; and capacitor insulator between the lower and upper capacitor electrodes; the lower capacitor electrodes individually comprising:
        a hollow longitudinally-elongated conductive cylinder-like portion; and
        a pair of non-hollow longitudinally-elongated conductive cylinder-like portions electrically coupled with the hollow cylinder-like portion, the non-hollow cylinder-like portions being radially of and extending longitudinally all along one of two diametrically opposed longitudinal sides of the hollow cylinder-like portion; and
    elevationally-extending conductive conduits beneath and to which the lower capacitor electrodes individually electrically couple, one of the non-hollow cylinder-like portions of the pair having a lowest surface all of which is directly against an uppermost surface of individual of the conduits.

4. An array of capacitors comprising:
    an array of lower capacitor electrodes of individual of the capacitors; an upper capacitor electrode common to the individual lower capacitor electrodes; and capacitor insulator between the lower and upper capacitor electrodes; the lower capacitor electrodes individually comprising:
        a hollow longitudinally-elongated conductive cylinder-like portion; and
        a pair of non-hollow longitudinally-elongated conductive cylinder-like portions electrically coupled with the hollow cylinder-like portion, the non-hollow cylinder-like portions being radially of and extending longitudinally along one of two diametrically opposed longitudinal sides of the hollow cylinder-like portion; and
    elevationally-extending conductive conduits beneath and to which the lower capacitor electrodes individually electrically couple, one of the non-hollow cylinder-like portions of the pair having a lowest surface all of which is directly against an uppermost surface of individual of the conduits, the other of the non-hollow cylinder-like portions of the pair not being directly against said individual conduit.

5. An array of capacitors of claim 4 wherein the non-hollow cylinder-like portions extend longitudinally all along one of the two diametrically opposed longitudinal sides of the hollow cylinder-like portion.

6. A capacitor comprising:
    a lower capacitor electrode, an upper capacitor electrode, and capacitor insulator between the lower and upper capacitor electrodes; the lower capacitor electrode comprising:
        a hollow longitudinally-elongated conductive cylinder-like portion; and
        multiple non-hollow longitudinally-elongated conductive cylinder-like portions electrically coupled with the hollow cylinder-like portion, the non-hollow cylinder-like portions being radially of and extending longitudinally along a longitudinal side surface of the hollow cylinder-like portion, the lower capacitor electrode comprising more than two of said non-hollow longitudinally-elongated conductive cylinder-like portions and which are circumferentially spaced relative one another.

7. The capacitor of claim 6 wherein the more than two of said non-hollow cylinder-like portions extend longitudinally all along the longitudinal side surface of the hollow cylinder-like portion.

8. A capacitor comprising:
    a lower capacitor electrode, an upper capacitor electrode, and capacitor insulator between the lower and upper capacitor electrodes; the lower capacitor electrode comprising:
        a hollow longitudinally-elongated conductive cylinder-like portion; and
        a non-hollow longitudinally-elongated conductive cylinder-like portion electrically coupled with the hollow cylinder-like portion, the non-hollow cylinder-like portion being radially of and extending longitudinally along a longitudinal side surface of the hollow cylinder-like portion, the lower capacitor electrode comprising no more than one of said non-hollow longitudinally-elongated conductive cylinder-like portion.

9. The capacitor of claim 8 wherein the non-hollow cylinder-like portion extends longitudinally all along the longitudinal side surface of the hollow cylinder-like portion.

10. An array of capacitors comprising:
    an array of lower capacitor electrodes of individual of the capacitors; an upper capacitor electrode common to the individual lower capacitor electrodes; and capacitor insulator between the lower and upper capacitor electrodes; the lower capacitor electrodes individually comprising:
- a hollow longitudinally-elongated conductive cylinder-like portion; and
- multiple non-hollow longitudinally-elongated conductive cylinder-like portions electrically coupled with the hollow cylinder-like portion, the non-hollow cylinder-like portions being radially of and extending longitudinally along a longitudinal side surface of the hollow cylinder-like portion, the lower capacitor electrode comprising more than two of said non-hollow longitudinally-elongated conductive cylinder-like portions and which are circumferentially spaced relative one another.

11. An array of capacitors of claim 10 wherein the non-hollow cylinder-like portions extend longitudinally all along the longitudinal side surface of the hollow cylinder-like portion.

12. An array of capacitors comprising:
an array of lower capacitor electrodes of individual of the capacitors; an upper capacitor electrode common to the individual lower capacitor electrodes; and capacitor insulator between the lower and upper capacitor electrodes; the lower capacitor electrodes individually comprising:
- a hollow longitudinally-elongated conductive cylinder-like portion; and
- a non-hollow longitudinally-elongated conductive cylinder-like portion electrically coupled with the hollow cylinder-like portion, the non-hollow cylinder-like portion being radially of and extending longitudinally along a longitudinal side surface of the hollow cylinder-like portion, the lower capacitor electrode comprising no more than one of said non-hollow longitudinally-elongated conductive cylinder-like portion.

13. An array of capacitors of claim 12 wherein the non-hollow cylinder-like portions extend longitudinally all along the longitudinal side surface of the hollow cylinder-like portion.

14. An array of capacitors of claim 12 wherein the non-hollow cylinder-like portions extend longitudinally all along the longitudinal side surface of the hollow cylinder-like portion.

15. A capacitor comprising:
a lower capacitor electrode, an upper capacitor electrode, and capacitor insulator between the lower and upper capacitor electrodes; the lower capacitor electrode comprising:
- a hollow longitudinally-elongated conductive cylinder-like portion; and
- a non-hollow longitudinally-elongated conductive cylinder-like portion electrically coupled with and directly against the hollow cylinder-like portion, the non-hollow cylinder-like portion being radially of and extending longitudinally along a longitudinal side surface of the hollow cylinder-like portion, the non-hollow longitudinally-elongated conductive cylinder-like portion comprising different composition conductive material from that of the hollow longitudinally-elongated conductive cylinder-like portion.

* * * * *